(12) United States Patent
Nagae et al.

(10) Patent No.: US 9,164,129 B2
(45) Date of Patent: Oct. 20, 2015

(54) VOLTAGE DETECTION CIRCUIT

(71) Applicant: KAYABA INDUSTRY CO., LTD., Minato-ku, Tokyo (JP)

(72) Inventors: Kouki Nagae, Sagamihara (JP); Noboru Yoshida, Kakamigahara (JP); Shinichiro Hakamada, Zama (JP)

(73) Assignee: KAYABA INDUSTRY CO., LTD., Tokyo (JP)

( * ) Notice: Subject to any disclaimer, the term of this patent is extended or adjusted under 35 U.S.C. 154(b) by 0 days.

(21) Appl. No.: 14/380,934

(22) PCT Filed: Apr. 16, 2013

(86) PCT No.: PCT/JP2013/061324
§ 371 (c)(1),
(2) Date: Aug. 25, 2014

(87) PCT Pub. No.: WO2013/183371
PCT Pub. Date: Dec. 12, 2013

(65) Prior Publication Data
US 2015/0015242 A1  Jan. 15, 2015

(30) Foreign Application Priority Data
Jun. 5, 2012  (JP) .................. 2012-127835

(51) Int. Cl.
G01R 1/30      (2006.01)
G01R 1/20      (2006.01)
G01R 19/00    (2006.01)

(52) U.S. Cl.
CPC ............. G01R 1/20 (2013.01); G01R 19/0053 (2013.01); G01R 19/0084 (2013.01)

(58) Field of Classification Search
CPC ........................................................ G01R 1/20

USPC ....... 324/98, 123 R, 124, 606, 647, 656, 665, 324/672, 679, 705
See application file for complete search history.

(56) References Cited

U.S. PATENT DOCUMENTS 5,271,041 A * 12/1993 Montreuil ...................... 375/344
5,532,592 A *  7/1996 Colclough .................... 324/248
(Continued)

FOREIGN PATENT DOCUMENTS

JP          6179170 A     4/1986
JP       2005201867 A     7/2005
(Continued)

OTHER PUBLICATIONS

International Search Report dated Jul. 30, 2013, corresponds to PCT/JP2013/061324.
(Continued)

Primary Examiner — Huy Q Phan
Assistant Examiner — Dustin Dickinson
(74) Attorney, Agent, or Firm — Hauptman Ham, LLP

(57) ABSTRACT

A voltage detection circuit includes: an amplifier which amplifies a voltage difference between first and second input signals input into non-inverting and inverting input terminals of the amplifier via first and second input portions; a first signal line which connects the first input portion to the amplifier; a second signal line which connects the second input portion to the amplifier; a first capacitor connected in parallel to the first signal line; a second capacitor connected in parallel to the second signal line; a first filter element which has an inductor component and a resistor component and is connected in series to the first signal line between the first capacitor and the amplifier; and a second filter element which has an inductor component and a resistor component and is connected in series to the second signal line between the second capacitor and the amplifier.

5 Claims, 2 Drawing Sheets

(56) References Cited

U.S. PATENT DOCUMENTS

| | | | |
|---|---|---|---|
| 5,801,552 A | 9/1998 | Moore | |
| 2005/0189949 A1 | 9/2005 | Shimizu et al. | |
| 2006/0261860 A1 | 11/2006 | Yamada | |
| 2009/0058552 A1* | 3/2009 | Oiwa | 333/32 |
| 2011/0031812 A1 | 2/2011 | Morimoto | |
| 2012/0086430 A1* | 4/2012 | Marten | 324/76.11 |

FOREIGN PATENT DOCUMENTS

| | | |
|---|---|---|
| JP | 2007173980 A | 7/2007 |
| JP | 200942080 A | 2/2009 |
| JP | 2012127835 A | 7/2012 |

OTHER PUBLICATIONS

Written Opinion dated Jul. 30, 2013, corresponds to PCT/JP2013/061324.
Decision to Grant a Patent mailed Oct. 1, 2013, corresponds to Japanese patent application No. 2012-127835.
Extended European Search Report issued May 8, 2014, corresponds to European patent application No. 13799919.9.
Office Action mailed Oct. 15, 2014, corresponding to Russian patent application No. 2014103970/28(006222).

* cited by examiner

VOLTAGE DETECTION CIRCUIT

TECHNICAL FIELD

The present invention relates to a voltage detection circuit capable of detecting a voltage difference between two input signals.

BACKGROUND ART

A chip bead may be used in an electronic circuit such as a voltage detection circuit as a filter element for removing noise included in an input signal or the like. A chip bead is an electronic component through which a required signal is passed. The chip bead absorbs noise in a high frequency band of the signal, and discharges the absorbed noise in the form of heat.

Japanese patent application No. 2005-365378 discloses a technique of removing noise included in a signal by disposing chip beads in an electronic circuit built into a remote controller for earphones connected to a portable telephone.

SUMMARY OF INVENTION

However, a certain degree of variation exists in an impedance characteristic of a chip bead due to manufacturing errors and the like.

Therefore, in a voltage detection circuit 200 that amplifies and outputs a voltage difference between two input signals, as shown in FIG. 2, when chip beads 51, 52 are disposed on signal lines 10, 20 further toward the side of input terminals 1, 2 than capacitors 41, 42, variation occurs in a voltage drop implemented on the input signals by the chip beads 51, 52 due to variation in the impedance characteristics of the chip beads 51, 52. As a result, the voltage difference between the two signals input into a differential amplifier 60 (an amplifier) varies, leading to a reduction in a precision of a voltage value output from the differential amplifier 60.

An object of the present invention is to provide a voltage detection circuit with which a reduction in a precision of a voltage value output from an amplifier can be suppressed.

According to an aspect of the present invention, a voltage detection circuit includes: a first input portion into which a first input signal is input; a second input portion into which a second input signal is input; an amplifier having an inverting input terminal and a non-inverting input terminal, which determines a voltage difference between the first input signal, which is input into the non-inverting input terminal via the first input portion, and the second input signal, which is input into the inverting input terminal via the second input portion, and amplifies the determined voltage difference; a first signal line which connects the first input portion to the non-inverting input terminal of the amplifier; a second signal line which connects the second input portion to the inverting input terminal of the amplifier; a first capacitor connected in parallel to the first signal line; a second capacitor connected in parallel to the second signal line; a first filter element which has an inductor component and a resistor component and is connected in series to the first signal line between the first capacitor and the non-inverting input terminal of the amplifier; and a second filter element which has an inductor component and a resistor component and is connected in series to the second signal line between the second capacitor and the inverting input terminal of the amplifier.

Embodiments and advantages of the present invention will be described in detail below with reference to the attached figures.

DESCRIPTION OF EMBODIMENTS

Figure 1:
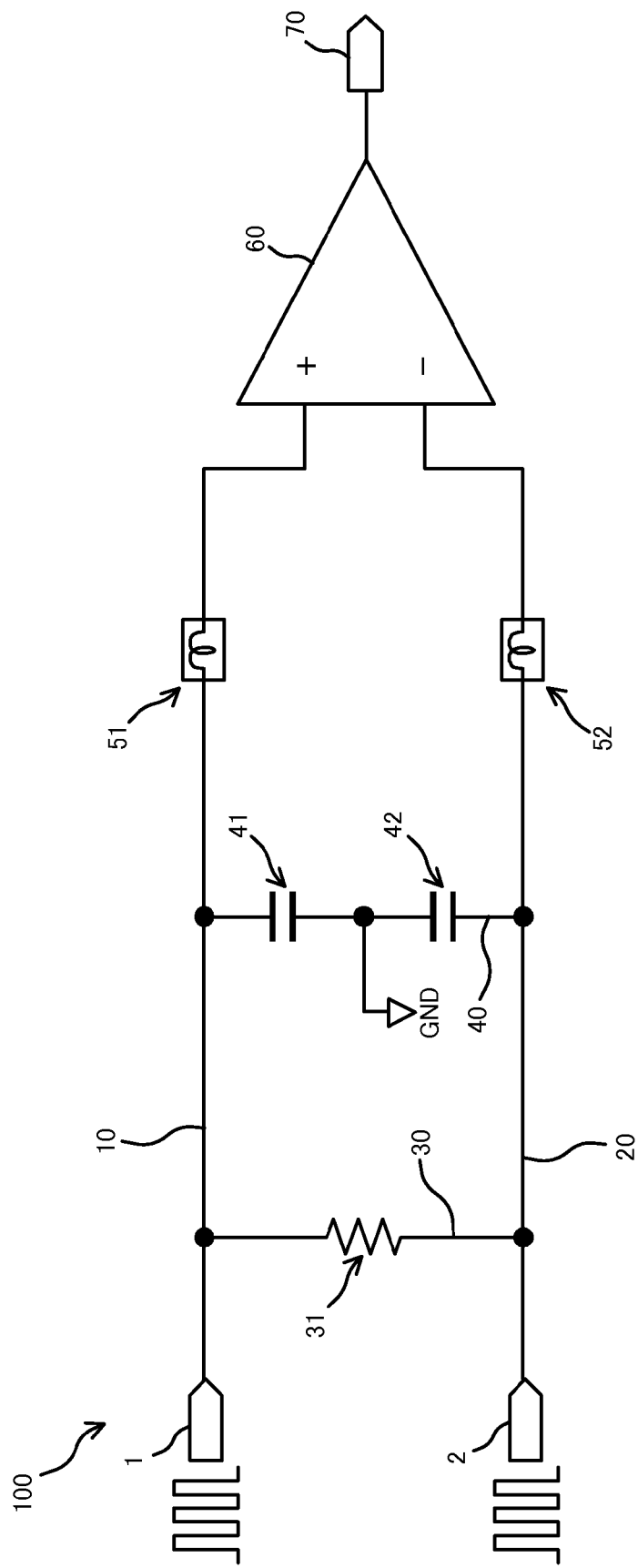
FIG. 1 is a schematic view showing a configuration of a voltage detection circuit according to an embodiment of the present invention.

Referring to FIG. 1, a voltage detection circuit 100 according to an embodiment of the present invention will be described.

The voltage detection circuit 100 includes a first input terminal 1, a second input terminal 2, a differential amplifier 60 (an amplifier) having an inverting input terminal and a non-inverting input terminal, a first signal line 10 connecting the first input terminal 1 to the non-inverting input terminal of the differential amplifier 60, and a second signal line 20 connecting the second input terminal 2 to the inverting input terminal of the differential amplifier 60.

The first signal line 10 and the second signal line 20 are connected by a first connecting line 30 and a second connecting line 40.

A resistor 31 having a resistance value of several [mΩ] is disposed on the first connecting line 30. Further, a first capacitor 41 positioned close to the first signal line 10 and a second capacitor 42 positioned close to the second signal line 20 are disposed on the second connecting line 40, which is provided further toward the differential amplifier 60 side than the first connecting line 30. The second connecting line 40 is grounded in a position between the first capacitor 41 and the second capacitor 42. Capacitors having a capacitance of several thousand [pF] are used as the first capacitor 41 and the second capacitor 42.

Hence, the first capacitor 41 is provided such that one end is connected (connected in parallel) to the first signal line 10 and the other end is grounded, while the second capacitor 42 is provided such that one end is connected (connected in parallel) to the second signal line 20 and the other end is grounded.

A rectangular wave voltage signal is input into the first input terminal 1 as a first input signal. Accordingly, a voltage corresponding to the voltage signal input into the first input terminal 1 is applied to one end of the resistor 31. A voltage at another end of the resistor 31 takes a voltage value dropped by an amount corresponding to the resistance value of the resistor 31. In other words, a rectangular wave voltage signal obtained by dropping the voltage of the rectangular wave voltage signal on the first input terminal 1 side by the resistance value of the resistor 31 is input into the second input terminal 2 as a second input signal.

In addition to the first capacitor 41 and the second capacitor 42 described above, the voltage detection circuit 100 is provided with a first chip bead 51 and a second chip bead 52 for removing noise from the first input signal and the second input signal.

The first chip bead 51 is disposed on (connected in series to) the first signal line 10 between the first capacitor 41 and the differential amplifier 60, while the second chip bead 52 is disposed on (connected in series to) the second signal line 20 between the second capacitor 42 and the differential amplifier 60.

The first chip bead 51 and the second chip bead 52 are electronic components serving as noise filter elements having an inductor component and a resistor component, which pass signals in a predetermined frequency band while removing noise in a high frequency band. Chip beads exhibiting a maximum impedance (several hundred [Ω]) at a frequency of several hundred [MHz] are used as the first chip bead 51 and the second chip bead 52. It should be noted that the impedance of a chip bead typically takes a smaller value than an input impedance of an operational amplifier such as a differential amplifier.

Of the noise included in the signal supplied to the differential amplifier 60 from the first input terminal 1, noise in a predetermined low frequency band is removed by the resistor component of the first chip bead 51 and the first capacitor 41, while noise in a predetermined high frequency band is removed by the inductor component and the resistor component of the first chip bead 51.

Similarly, of the noise included in the signal supplied to the differential amplifier 60 from the second input terminal 2, noise in the predetermined low frequency band is removed by the resistor component of the second chip bead 52 and the second capacitor 42, while noise in the predetermined high frequency band is removed by the inductor component and the resistor component of the second chip bead 52.

The voltage detection circuit 100 thus configured leads a voltage difference between the first input signal and the second input signal (a voltage difference at the respective ends of the resistor 31) to the differential amplifier 60, where the voltage difference is amplified, and then outputs the amplified voltage difference from an output terminal 70.

Next, a relationship between a voltage drop occurring in the first chip bead 51 and the second chip bead 52 and a precision of the voltage value output from the differential amplifier 60 will be described by comparing the voltage detection circuit 100 according to this embodiment with the voltage detection circuit 200 serving as a reference example of the related art.

Figure 2:
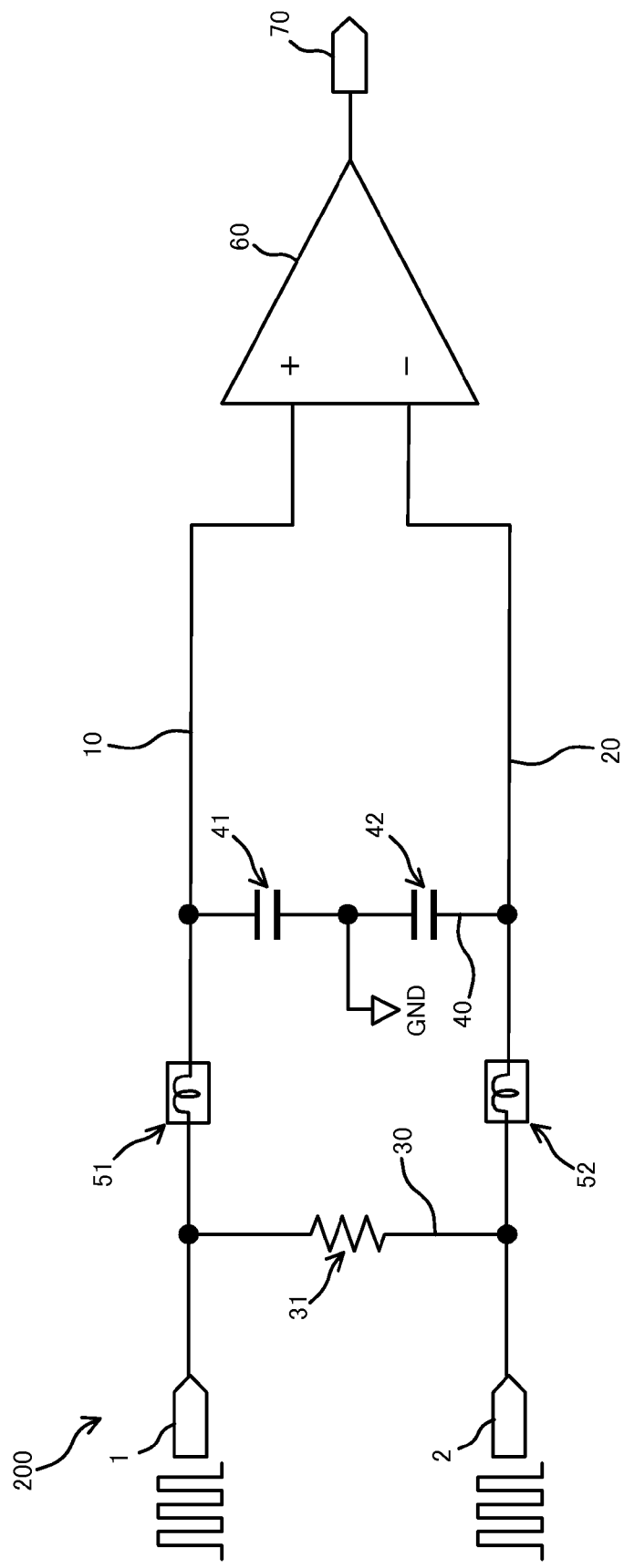
FIG. 2 is a schematic view showing a configuration of a voltage detection circuit serving as a reference example of the related art.

In the voltage detection circuit 200 shown in FIG. 2, members exhibiting identical functions to their counterparts in the voltage detection circuit 100 have been allocated identical reference numerals. The voltage detection circuit 200 serving as the reference example and the voltage detection circuit 100 according to this embodiment are configured substantially identically, but differ from each other in the disposal positions of the first chip bead 51 and the second chip bead 52. In the voltage detection circuit 200, the first chip bead 51 is disposed on the first signal line 10 upstream of the first capacitor 41, and the second chip bead 52 is disposed on the second signal line 20 upstream of the second capacitor 42.

In the voltage detection circuit 200, when the first input signal and the second input signal constituted by rectangular wave voltage signals are input, charging/discharging is performed in the first capacitor 41 and the second capacitor 42 on the basis of the input signals. At this time, the voltage of the first input signal is dropped on the basis of the impedance of the first chip bead 51, and the voltage of the second input signal is dropped on the basis of the impedance of the second chip bead 52.

The impedance of the first chip bead 51 and the second chip bead 52 varies due to manufacturing errors and the like, and therefore variation also occurs in the voltage drop applied to the input signals in the first chip bead 51 and the second chip bead 52. As a result, variation occurs in the voltage difference between the two signals input into the differential amplifier 60, leading to a reduction in the precision of the voltage value output from the differential amplifier 60.

In the voltage detection circuit 100 according to this embodiment, on the other hand, the chip beads are not disposed upstream of the first capacitor 41 and the second capacitor 42, and therefore, even when the first input signal and the second input signal are input and charging/discharging is performed in the first capacitor 41 and the second capacitor 42, a voltage drop is not caused by the chip beads. As a result, the voltage corresponding to the first input signal is applied as is to one end of the first capacitor 41, and the voltage corresponding to the second signal is applied as is to one end of the second capacitor 42.

In the voltage detection circuit 100, the first chip bead 51 and the second chip bead 52 are disposed downstream of the first capacitor 41 and the second capacitor 42. Moreover, an input impedance of the differential amplifier 60 is considerably larger than that of the first chip bead 51 and the second chip bead 52. Therefore, a current passing through the first chip bead 51 and the second chip bead 52 of the voltage detection circuit 100 is smaller than a current passing through the first chip bead 51 and the second chip bead 52 of the voltage detection circuit 200.

Hence, the voltage drop applied to the input signals in the first chip bead 51 and the second chip bead 52 is small, and therefore the effect of the variation in the impedance of the respective chip beads 51, 52 can be reduced. As a result, variation in the voltage difference between the two signals input into the differential amplifier 60 can be suppressed.

With the voltage detection circuit 100 according to this embodiment, therefore, a reduction in the precision of the voltage value output from the differential amplifier 60 can be suppressed.

An embodiment of the present invention was described above, but the above embodiment merely illustrates a part of examples of applications of the present invention, and the technical scope of the present invention is not limited to the specific configurations described in the embodiment.

The voltage detection circuit 100 according to this embodiment may be a circuit that detects the voltage difference between the first input signal input from the first input terminal 1 and the second input signal input from the second input terminal 2 without the use of the resistor 31.

The present application claims priority based on Japanese Patent Application No. 2012-127835, filed with the Japan Patent Office on Jun. 5, 2012, the entire contents of which are incorporated into this specification by reference.

The invention claimed is:

1. A voltage detection circuit comprising:
   a first input portion configured to receive a first input signal;
   a second input portion configured to receive a second input signal;
   an amplifier having an inverting input terminal and a non-inverting input terminal, the amplifier configured to
      determine a voltage difference between the first input signal, which is input into the non-inverting input terminal via the first input portion, and the second input signal, which is input into the inverting input terminal via the second input portion, and
      amplify the determined voltage difference;
   a first signal line which connects the first input portion to the non-inverting input terminal of the amplifier;
   a second signal line which connects the second input portion to the inverting input terminal of the amplifier;
   a first capacitor having
      a first end which is connected to the first signal line, and
      a second end which is grounded;
   a second capacitor having
      a first end which is connected to the second signal line, and
      a second end which is grounded;

a first filter element which has an inductor component and a resistor component, and is connected in series in the first signal line between the first end of the first capacitor and the non-inverting input terminal of the amplifier; and a second filter element which has an inductor component and a resistor component, and is connected in series in the second signal line between the first end of the second capacitor and the inverting input terminal of the amplifier.

2. The voltage detection circuit as defined in claim 1, wherein the first filter element and the second filter element are chip beads.

3. The voltage detection circuit as defined in claim 1, wherein the first input signal and the second input signal are rectangular wave voltage signals.

4. The voltage detection circuit as defined in claim 2, wherein an impedance of each of the chip beads is smaller than an input impedance of the amplifier.

5. The voltage detection circuit as defined in claim 1, wherein the second ends of the first and second capacitors are always grounded.

* * * * *